(12) United States Patent
Leobandung

(10) Patent No.: US 9,548,358 B2
(45) Date of Patent: Jan. 17, 2017

(54) DUAL FILL SILICON-ON-NOTHING FIELD EFFECT TRANSISTOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 39 days.

(21) Appl. No.: 14/280,777

(22) Filed: May 19, 2014

(65) Prior Publication Data

US 2015/0333167 A1 Nov. 19, 2015

(51) Int. Cl.
 *H01L 29/78* (2006.01)
 *H01L 29/06* (2006.01)
 *H01L 29/66* (2006.01)

(52) U.S. Cl.
 CPC ....... *H01L 29/0673* (2013.01); *H01L 29/0669* (2013.01); *H01L 29/66* (2013.01); *H01L 29/66545* (2013.01); *H01L 29/78* (2013.01)

(58) Field of Classification Search
 USPC .......................................... 257/347; 438/151
 See application file for complete search history.

(56) References Cited

U.S. PATENT DOCUMENTS

| | | | |
|---|---|---|---|
| 7,517,764 B2 | 4/2009 | Booth et al. | |
| 8,293,616 B2 | 10/2012 | Chang et al. | |
| 8,361,869 B2 | 1/2013 | Zhou et al. | |
| 2011/0198676 A1 | 8/2011 | Luo et al. | |
| 2012/0138886 A1 | 6/2012 | Kuhn et al. | |
| 2013/0161729 A1 | 6/2013 | Xie | |

FOREIGN PATENT DOCUMENTS

WO 2013095651 A1 6/2013

OTHER PUBLICATIONS

Tripathi, S.L. et al., "High performance Bulk FinFET with Bottom Spacer" Proc. IEEE International Conference on Electronics, Computing and Communication Technologies (CONECCT)(Jan. 2013) pp. 1-5.

(Continued)

*Primary Examiner* — Hrayr A Sayadian
(74) *Attorney, Agent, or Firm* — Scully, Scott, Murphy & Presser, P.C.; Louis J. Percello, Esq.

(57) ABSTRACT

A patterned stack of a first silicon-germanium alloy nanowire, a second silicon-germanium alloy nanowire, and a silicon-containing nanowire is formed on a substrate. After formation of a first dielectric isolation layer around the patterned stack, a disposable gate structure can be formed. End portions of the second silicon-germanium alloy nanowire are removed to form first cavities underlying end portions of the silicon-containing nanowire. Dielectric nanowires are formed in cavities concurrently with formation of a gate spacer. After recessing the first dielectric isolation layer, a second cavity is formed by removing the first silicon-germanium alloy nanowire. The second cavity is filled with a second dielectric isolation layer, and raised active regions can be formed by a selective epitaxy process. After formation of a planarization dielectric layer, the disposable gate structure and the remaining portion of the second silicon-germanium alloy nanowire with a replacement gate structure.

10 Claims, 12 Drawing Sheets

(56) References Cited

OTHER PUBLICATIONS

Liao, Y.B. et al., "Optimal Device Design of FinFETs on a Bulk Substrate" Proc. IEEE 4th International Nanoelectronics Conference (INEC) (Jun. 21-24, 2011) pp. 1-2.
Liao, Y.B. et al, "A pragmatic design methodology using proper isolation and doping for bulk FinFETs" Solid-State Electronics (Jul. 2013) pp. 48-53, vol. 85.

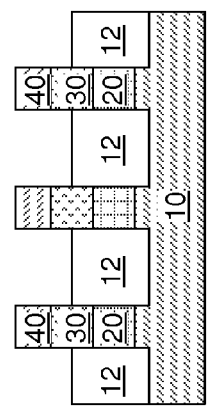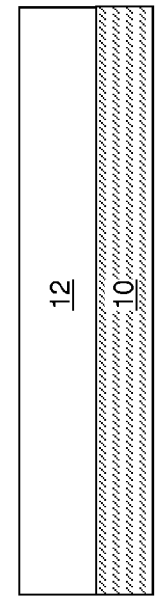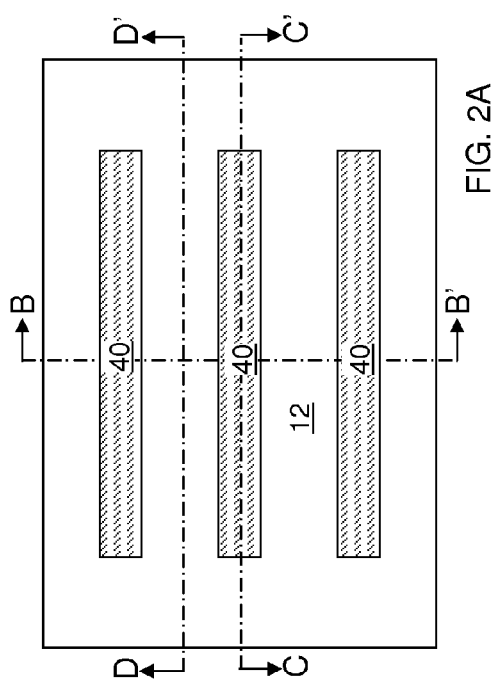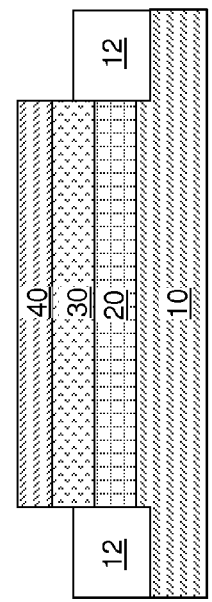

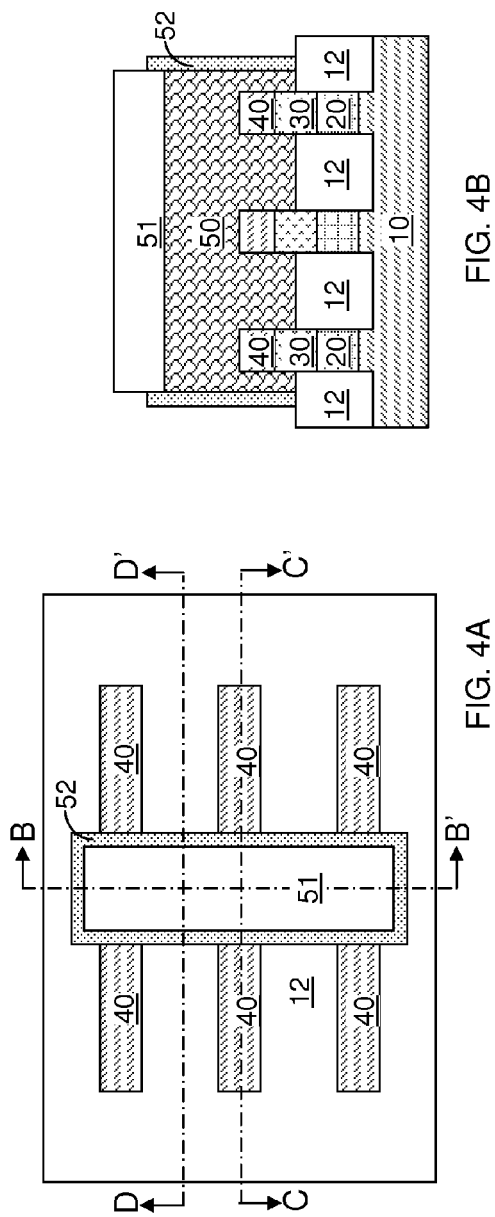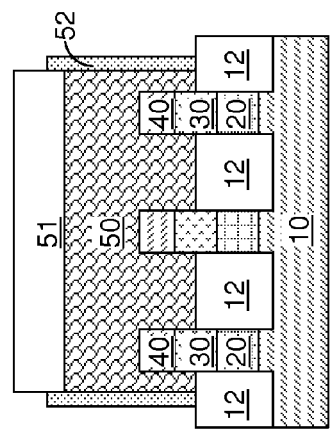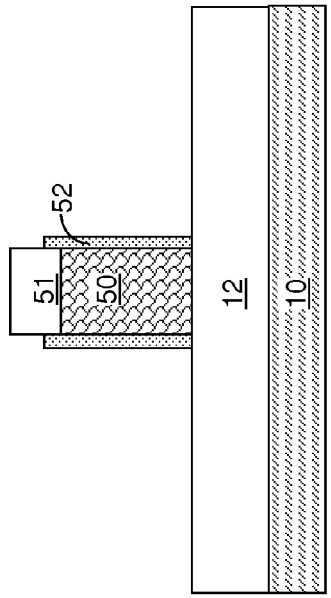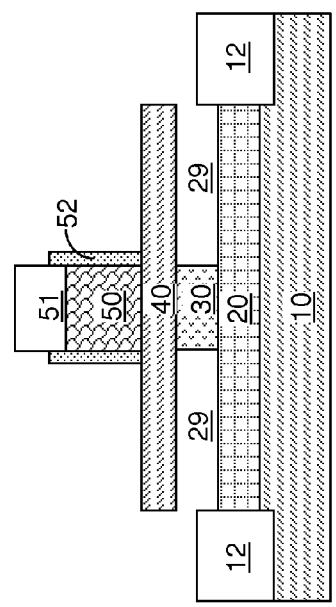

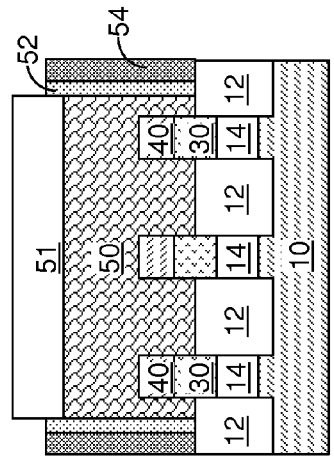
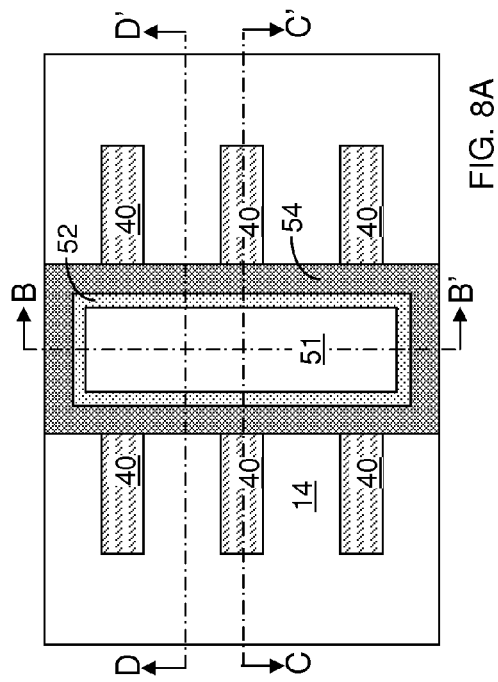
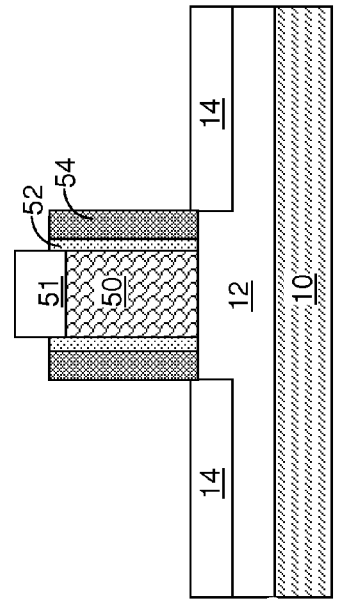
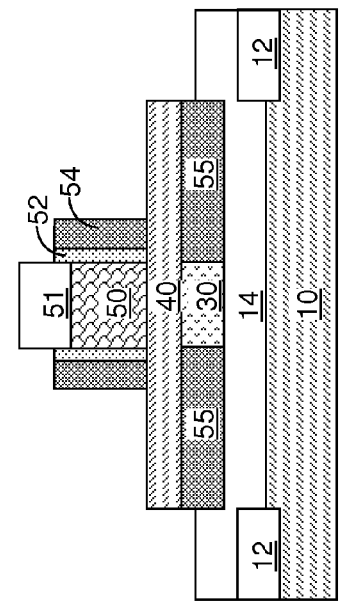
FIG. 8B
FIG. 8A
FIG. 8D
FIG. 8C

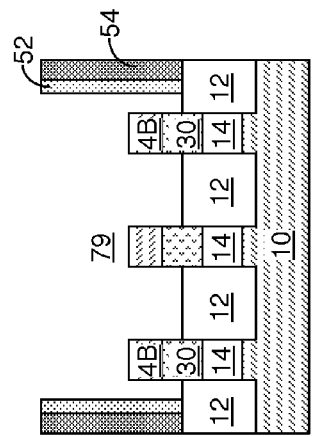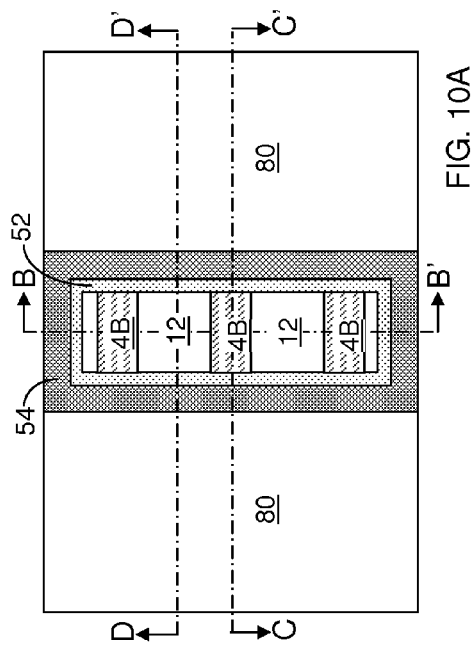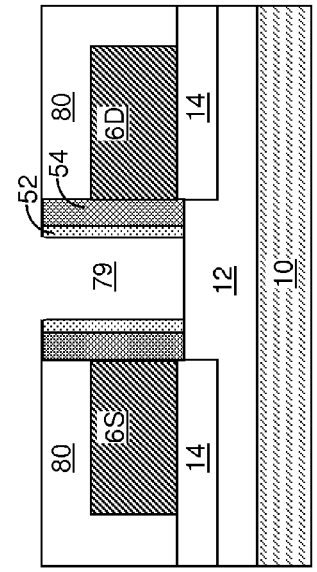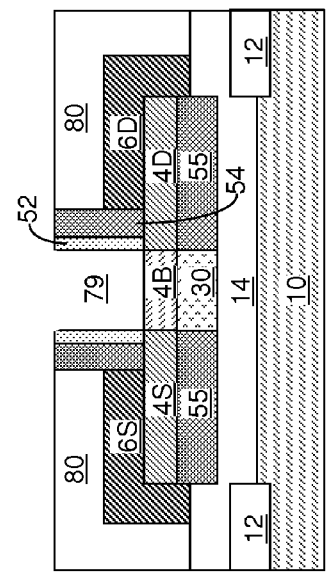

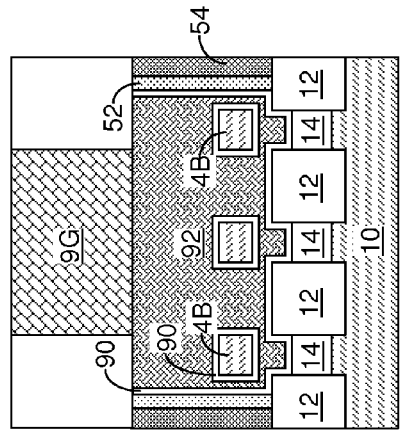
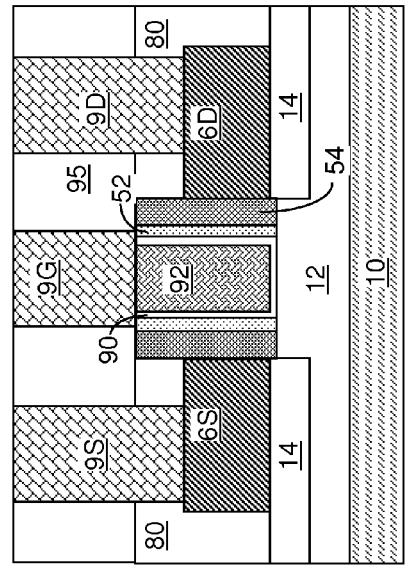
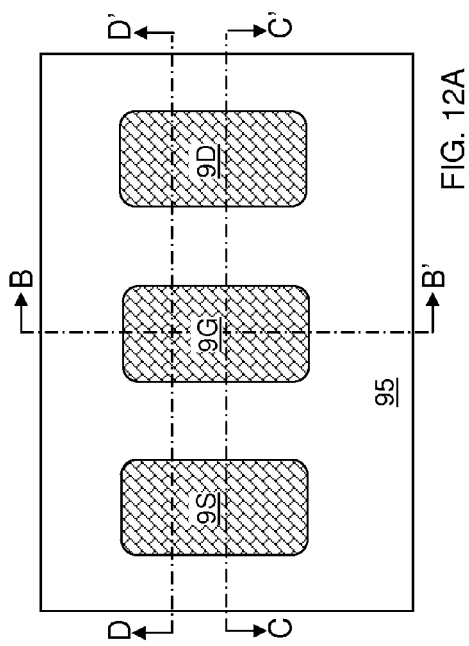
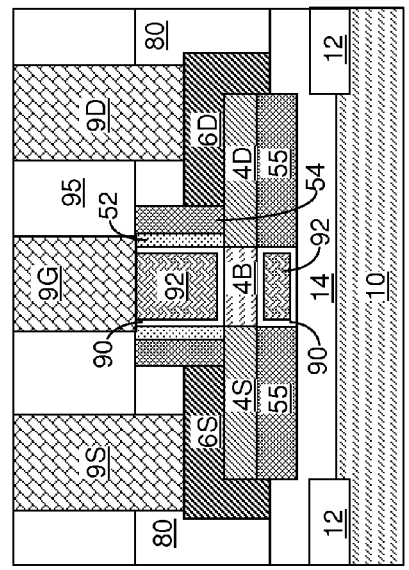
FIG. 12A
FIG. 12B
FIG. 12C
FIG. 12D

DUAL FILL SILICON-ON-NOTHING FIELD EFFECT TRANSISTOR

BACKGROUND

The present disclosure relates to a semiconductor structure, and particularly to a field effect transistor including a wraparound gate formed by dual replacement of disposable layers and a method of manufacturing the same.

The degree of control of electronic transport in the channel region of a field effect transistor is a predominant factor determining the level of leakage currents. A wraparound gate is a configuration that enhances control of the electronic transport in the channel region of a field effect transistor. However, formation of a wraparound gate typically requires multiple additional processing steps, thereby increasing the processing time and cost during manufacturing. Further, integration schemes that employ a semiconductor-on-insulator (SOI) substrate increase the cost of production because SOI substrates are more expensive than bulk substrates. Thus, a simple process integration scheme for reliably forming a wraparound gate structure employing a bulk semiconductor substrate is desired.

SUMMARY

A patterned stack of a first silicon-germanium alloy nanowire, a second silicon-germanium alloy nanowire, and a silicon-containing nanowire is formed on a substrate. After formation of a first dielectric isolation layer around the patterned stack, a disposable gate structure can be formed. End portions of the second silicon-germanium alloy nanowire are removed to form first cavities underlying end portions of the silicon-containing nanowire. Dielectric nanowires are formed in cavities concurrently with formation of a gate spacer. After recessing the first dielectric isolation layer, a second cavity is formed by removing the first silicon-germanium alloy nanowire selective to a remaining portion of the second silicon-germanium alloy nanowire. The second cavity is filled with a second dielectric isolation layer, and raised active regions can be formed by a selective epitaxy process. After formation of a planarization dielectric layer, the disposable gate structure and the remaining portion of the second silicon-germanium alloy nanowire with a replacement gate structure, which is a wraparound gate structure.

According to an aspect of the present disclosure, a semiconductor structure includes at least one dielectric isolation layer located on a substrate, a silicon-containing nanowire overlying the at least one dielectric isolation layer, a pair of dielectric nanowires laterally spaced from each other, and contacting a bottom surface of the silicon-containing nanowire and a top surface of the at least one dielectric isolation layer, and a gate structure including a gate dielectric and a gate electrode, the gate structure encircling a portion of the silicon-containing nanowire.

According to another aspect of the present disclosure, a method of forming a semiconductor structure is provided. A stack including, from bottom to top, a first silicon-germanium alloy nanowire, a second silicon-germanium alloy nanowire, and a silicon-containing nanowire is formed on a substrate. A first dielectric isolation layer is formed around the stack and over the substrate. A gate structure is formed across the stack. First cavities are formed by removing end portions of the second silicon-germanium alloy nanowire while a portion of the second silicon-germanium alloy nanowire underlying the gate structure is not removed. A pair of dielectric nanowires is formed in the first cavities. A second cavity is formed by removing the first silicon-germanium alloy nanowire from underneath the pair of dielectric nanowires. The second cavity is filled with a second dielectric isolation layer.

BRIEF DESCRIPTION OF SEVERAL VIEWS OF THE DRAWINGS

FIG. 2A is a top-down view of an exemplary structure after formation of a first dielectric isolation layer according to an embodiment of the present disclosure.

FIG. 2B is a vertical cross-sectional view of the exemplary structure along the vertical plane B-B' of FIG. 2A.

FIG. 2C is a vertical cross-sectional view of the exemplary structure along the vertical plane C-C' of FIG. 2A.

FIG. 2D is a vertical cross-sectional view of the exemplary structure along the vertical plane D-D' of FIG. 2A.

FIG. 4A is a top-down view of an exemplary structure after removal of end portions of the second silicon-germanium alloy nanowire by an isotropic etch according to an embodiment of the present disclosure.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 4D is a vertical cross-sectional view of the exemplary structure along the vertical plane D-D' of FIG. 4A.

FIG. 8A is a top-down view of an exemplary structure after formation of a second dielectric isolation layer according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 8D is a vertical cross-sectional view of the exemplary structure along the vertical plane D-D' of FIG. 8A.

FIG. 10A is a top-down view of an exemplary structure after formation of a planarization dielectric layer and removal of the disposable gate structure according to an embodiment of the present disclosure.

FIG. 10B is a vertical cross-sectional view of the exemplary structure along the vertical plane B-B' of FIG. 10A.

FIG. 10C is a vertical cross-sectional view of the exemplary structure along the vertical plane C-C' of FIG. 10A.

FIG. 10D is a vertical cross-sectional view of the exemplary structure along the vertical plane D-D' of FIG. 10A.

FIG. 12A is a top-down view of an exemplary structure after formation of a replacement gate structure according to an embodiment of the present disclosure.

FIG. 12B is a vertical cross-sectional view of the exemplary structure along the vertical plane B-B' of FIG. 12A.

FIG. 12C is a vertical cross-sectional view of the exemplary structure along the vertical plane C-C' of FIG. 12A.

FIG. 12D is a vertical cross-sectional view of the exemplary structure along the vertical plane D-D' of FIG. 12A.

DETAILED DESCRIPTION

Figure 1A:
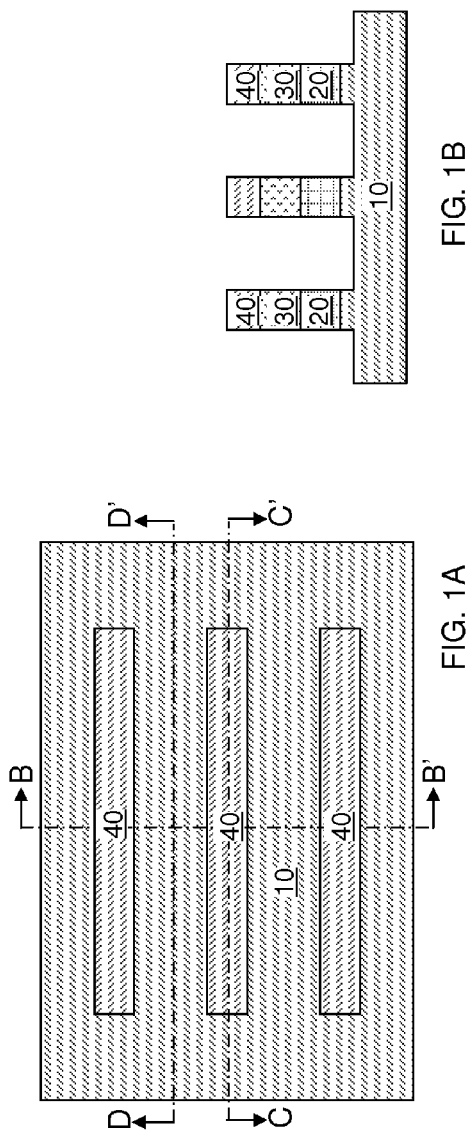
FIG. 1A is a top-down view of an exemplary structure after formation of a vertical stack including, from bottom to top, a first silicon-germanium alloy nanowire, a second silicon-germanium alloy nanowire, and a silicon-containing nanowire on a substrate according to an embodiment of the present disclosure.
Figure 1B:
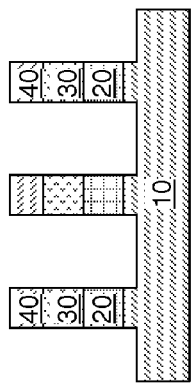
FIG. 1B is a vertical cross-sectional view of the exemplary structure along the vertical plane B-B' of FIG. 1A.
Figure 1C:
FIG. 1C is a vertical cross-sectional view of the exemplary structure along the vertical plane C-C' of FIG. 1A.
Figure 1D:
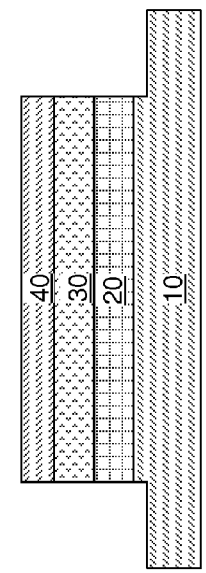
FIG. 1D is a vertical cross-sectional view of the exemplary structure along the vertical plane D-D' of FIG. 1A.
Figure 3A:
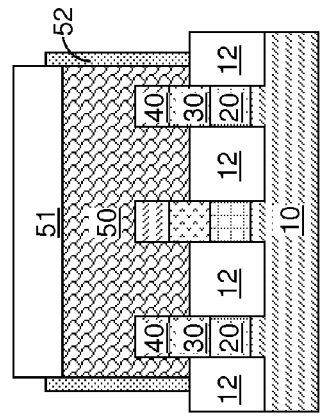
FIG. 3A is a top-down view of an exemplary structure after formation of a disposable gate structure and an inner gate spacer according to an embodiment of the present disclosure.
Figure 3B:
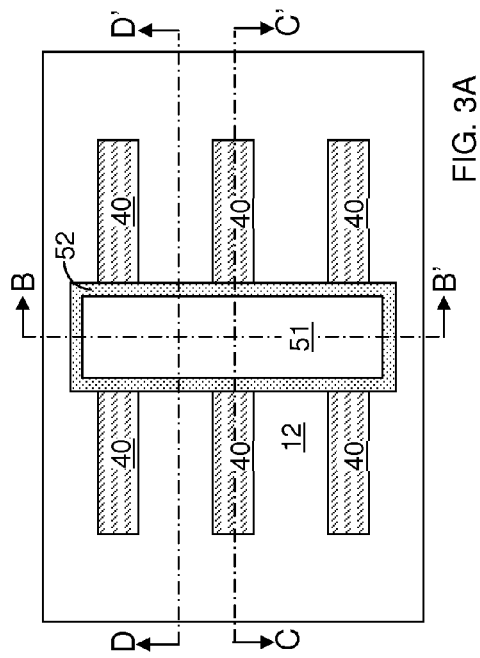
FIG. 3B is a vertical cross-sectional view of the exemplary structure along the vertical plane B-B' of FIG. 3A.
Figure 3C:
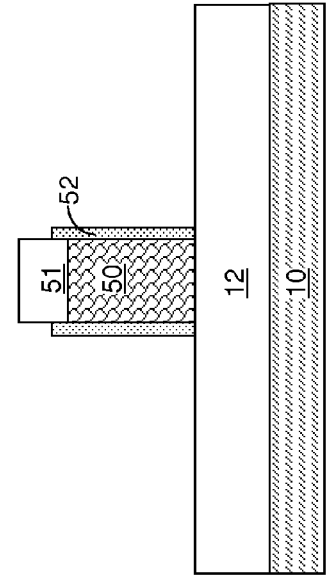
FIG. 3C is a vertical cross-sectional view of the exemplary structure along the vertical plane C-C' of FIG. 3A.
Figure 3D:
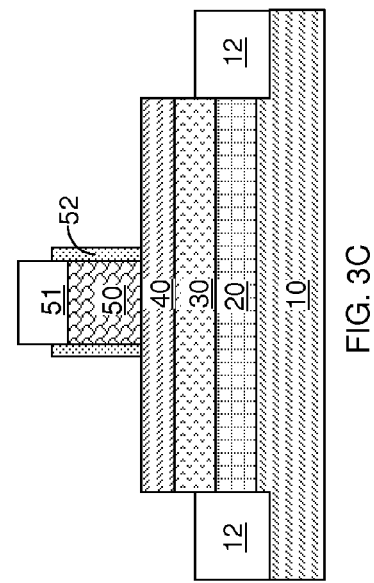
FIG. 3D is a vertical cross-sectional view of the exemplary structure along the vertical plane D-D' of FIG. 3A.
Figure 5A:
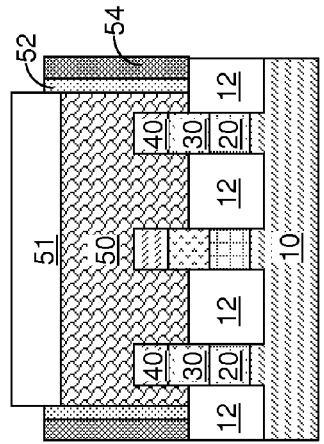
FIG. 5A is a top-down view of an exemplary structure after formation of an outer gate spacer and dielectric nanowires according to an embodiment of the present disclosure.
Figure 5B:
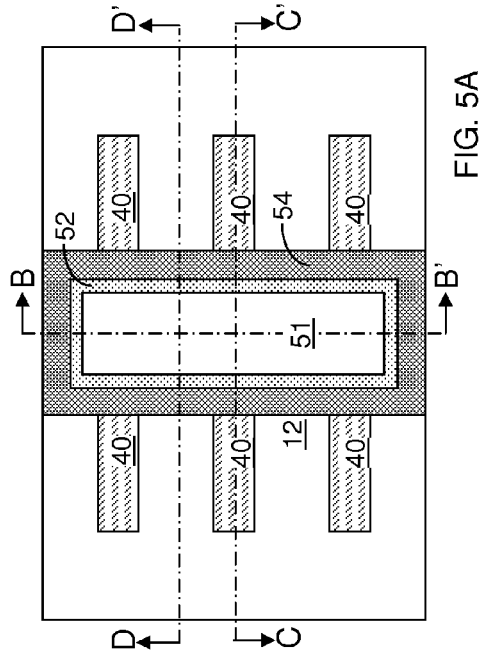
FIG. 5B is a vertical cross-sectional view of the exemplary structure along the vertical plane B-B' of FIG. 5A.
Figure 5C:
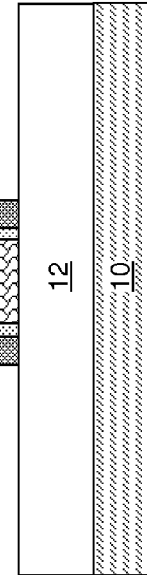
FIG. 5C is a vertical cross-sectional view of the exemplary structure along the vertical plane C-C' of FIG. 5A.
Figure 5D:
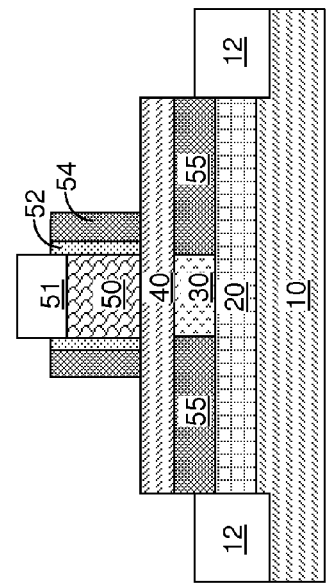
FIG. 5D is a vertical cross-sectional view of the exemplary structure along the vertical plane D-D' of FIG. 5A.

As stated above, the present disclosure relates to a field effect transistor including a wraparound gate formed by dual replacement of disposable layers and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A-1D, an exemplary structure according to an embodiment of the present disclosure includes vertical stacks (20, 30, 40) formed on a substrate 10. The substrate 10 can be a single crystalline silicon substrate that is thick enough to provide mechanical support to the vertical stacks (20, 30, 40). The substrate 10 as provided can be a blank (unpatterned) substrate having the same thickness throughout the entirety thereof. The thickness of the substrate 10 can be in a range from 50 micron to 2 mm.

The vertical stacks (20, 30, 40) can be formed by depositing material layers on the top surface of the substrate 10 and patterning the material layers. The material layers can include, from bottom to top, a first silicon-germanium alloy layer, a second silicon-germanium alloy layer, and a silicon-containing layer.

The first silicon-germanium alloy layer includes a first single crystalline silicon-germanium alloy having a first atomic concentration of germanium and epitaxially aligned to the single crystalline structure of the substrate 10. The first atomic concentration of germanium can be in a range from 20% to 99%, although lesser and greater atomic concentrations can also be employed. The thickness and the atomic concentration of the first silicon-germanium alloy layer are selected such that the entirety of the first silicon-germanium alloy layer remains single crystalline without strain relaxation through generation of dislocation defects. In one embodiment, the thickness of the first silicon-germanium alloy layer can be in a range from 3 nm to 50 nm, although lesser and greater thicknesses can also be employed. The first silicon-germanium alloy layer can be formed by a first epitaxial deposition process employing a silicon precursor and a germanium precursor.

The second silicon-germanium alloy layer includes a second single crystalline silicon-germanium alloy having a second atomic concentration of germanium and epitaxially aligned to the single crystalline structure of the first silicon-germanium alloy layer and the substrate 10. The second atomic concentration of germanium is less than the first atomic concentration of germanium. In one embodiment, the first atomic concentration of germanium can be greater than the second atomic concentration of geranium by a factor or 2 or more. In one embodiment, the second atomic concentration of germanium can be in a range from 3% to 30%, although lesser and greater atomic concentrations can also be employed. The thickness and the atomic concentration of the second silicon-germanium alloy layer are selected such that the entirety of the first silicon-germanium alloy layer remains single crystalline without strain relaxation through generation of dislocation defects. In one embodiment, the thickness of the first silicon-germanium alloy layer can be in a range from 5 nm to 100 nm, although lesser and greater thicknesses can also be employed. The second silicon-germanium alloy layer can be formed by a second epitaxial deposition process employing a silicon precursor and a germanium precursor, which may, or may not, be the same as the precursors employed for the first epitaxial deposition process.

The silicon-containing layer includes single crystalline silicon-containing semiconductor material that is epitaxially aligned to the single crystalline structure of the second silicon-germanium alloy layer, the first silicon-germanium alloy layer, and the substrate 10. In one embodiment, the silicon-containing layer can consist essentially of silicon atoms, or can consist essentially of silicon atoms and electrical dopant atoms that can be p-type dopant atoms or n-type dopant atoms. In another embodiment, the silicon-containing layer can consist essentially of silicon atoms at an atomic concentration not less than 97%, and carbon atoms at an atomic concentration not greater than 3%, and optional electrical dopant atoms at an atomic concentration not greater than 1%. In another embodiment, the silicon-containing layer can consist essentially of silicon atoms at an atomic concentration not less than 97%, and germanium atoms at an atomic concentration not greater than 3%, and optional electrical dopant atoms at an atomic concentration not greater than 1%. In one embodiment, the thickness of the silicon-containing layer can be in a range from 5 nm to 200 nm, although lesser and greater thicknesses can also be employed. The silicon-containing layer can be formed by a third epitaxial deposition process employing a silicon precursor and optionally additional precursors for incorporating atoms other than silicon atoms.

A photoresist layer (not shown) can be applied over the silicon-containing layer and lithographically patterned to cover rectangular regions. An anisotropic etch is performed to etch through physically exposed portions of the silicon-containing layer, the second silicon-germanium alloy layer, the first silicon-germanium alloy layer, and optionally, an upper portion of the substrate 10. Remaining portions of the first silicon-germanium alloy layer, the second silicon-germanium alloy layer, and the silicon-containing layer constitute the vertical stacks (20, 30, 40). Each vertical stack can include, from bottom to top, a first silicon-germanium alloy nanowire 20, a second silicon-germanium alloy nanowire 30, and a silicon-containing nanowire 40. As used herein, a "nanowire" refers to an elongated structure extending along a lengthwise direction and having lateral dimensions within a range from 1 nm to 100 nm. As used herein, a "lateral dimension" refers to the maximum extent of a structure within a plane that is perpendicular to the lengthwise direction of the structure. The photoresist layer can be subsequently removed, for example, by ashing.

Each remaining portion of the first silicon-germanium alloy layer constitutes a first silicon-germanium alloy nanowire 20. Each remaining portion of the second silicon-germanium alloy layer constitutes a second silicon-germanium alloy nanowire 30. Each remaining portion of the silicon-containing layer constitutes a silicon-containing nanowire 40. Within each vertical stack (20, 30, 40), the sidewalls of the first silicon-germanium alloy nanowire 20, the sidewalls of the second silicon-germanium alloy nanowire 30, and the sidewalls of the silicon-containing nanowire 40 can be vertically coincident among one another. As used herein, two surfaces are vertically coincident with each other if there exists a vertical plane including the two surfaces. In one embodiment, each of the first silicon-germanium alloy nanowire 20, the second silicon-germanium alloy nanowire 30, and the silicon-containing nanowire 40 within the same vertical stack (20, 30, 40) can have the same rectangular horizontal cross-sectional shape.

Referring to FIGS. 2A-2D, a first dielectric isolation layer 12 is formed around the vertical stacks (20, 30, 40) and over the substrate 10. The first dielectric isolation layer 12 includes a dielectric material such as silicon oxide, silicon nitride, or a dielectric metal oxide. In one embodiment, the first dielectric isolation layer 12 includes silicon oxide. The first dielectric isolation layer 12 can be formed, for example, by deposition of a dielectric material layer at least up to the height of the top surfaces of the silicon-containing nanowires 40, planarization of the dielectric material employing the top surfaces of the silicon-containing nanowires 40 as stopping layers, and recessing of the dielectric material to a height between the top surfaces and the bottom surfaces of the second silicon-germanium alloy nanowires 30. Alternately, the first dielectric isolation layer 12 can be formed by deposition of a self-planarizing dielectric material such as spin-on-glass (SOG).

The horizontal plane including the top surfaces of the second silicon-germanium alloy nanowires 30 and the bottom surfaces of the silicon-containing nanowires 40 is herein referred to as a first horizontal plane. The horizontal plane including the bottom surfaces of the second silicon-germanium alloy nanowires 30 and the top surfaces of the first silicon-germanium alloy nanowires 20 is herein referred to as a second horizontal plane. The top surface of the first dielectric isolation layer 12 is formed between the first horizontal plane and the second horizontal plane.

Referring to FIGS. 3A-4D, a disposable gate structure (50, 51) is formed across at least one vertical stack (20, 30, 40). The disposable gate structure (50, 51) is a gate structure that is removed in a subsequent processing step. The disposable gate structure (50, 51) can be formed, for example, by deposition of a disposable material layer and optionally a gate cap dielectric layer, and patterning of the stack of the disposable material layer and the gate cap dielectric layer. A remaining portion of the disposable material layer constitutes a disposable material portion 50. A remaining portion of the gate cap dielectric layer, if employed, constitutes a gate cap dielectric portion 51.

The disposable material portion 50 can include a semiconductor material, a dielectric material, or a metallic material, provided that the material of the disposable material portion 50 can be removed selective to the materials of a planarization dielectric layer and gate spacers to be subsequently formed and selective to the material of the silicon-containing nanowires 40. For example, the disposable material portion 50 can include amorphous carbon, diamond-like carbon (DLC), polycrystalline or amorphous germanium, a silicon-germanium alloy having an atomic concentration of germanium greater than 40%, organosilicate glass, a doped silicate glass, an elemental metal, an alloy of at least two elemental metals, a conductive metallic alloy, or a combination thereof.

The disposable gate structure (50, 51) straddles the at least one vertical stack (20, 30, 40) along the widthwise direction of the various semiconductor nanowires (20, 30, 40), which is the horizontal direction that is perpendicular to the lengthwise direction of the various semiconductor nanowires (20, 30, 40). Surfaces of the disposable gate structure (50, 51) can contact the top surface of the first dielectric isolation layer 12 and sidewalls of the second silicon-germanium alloy nanowires 30 and the silicon-containing nanowires 40.

Optionally, an inner gate spacer 52 including a dielectric material can be formed on the sidewalls of the disposable gate structure (50, 51). The inner gate spacer 52 can be formed, for example, by depositing a conformal dielectric material layer, and by anisotropically etching the conformal dielectric material layer. Horizontal portions of the conformal dielectric material layer are removed by the anisotropic etch, and remaining vertical portions of the conformal dielectric material layer constitute the inner gate spacer 52.

Referring to FIGS. 4A-4D, end portions of each second silicon-germanium alloy nanowire 30 are removed by an isotropic etch. The combination of the disposable gate structure (50, 51), the inner gate spacer 52, the silicon-containing nanowires 40, and the first dielectric isolation layer 12 functions as an etch mask that determines which portions of the second silicon-germanium alloy nanowires 30 are etched. The isotropic etch can be a wet etch or an isotropic dry etch. In one embodiment, the isotropic etch can be a wet etch employing hydrogen peroxide or a combination of hydrogen peroxide and diluted hydrofluoric acid as a wet etchant. The wet etchant oxidizes the germanium atoms in the second silicon-germanium alloy material and washes away the oxidized portions of the second silicon-germanium alloy material in the second silicon-germanium alloy nanowire 30.

The duration of the isotropic etch is selected such that a portion of each second silicon-germanium alloy nanowire 30 remains within each area in which the silicon-containing nanowires 40 and the disposable gate structure (50, 51) overlap in a top-down view. First cavities 29 are formed in spaces from which the material of the second silicon-germanium alloy nanowire 30 is removed. During, and after, removal of the end portions of the second silicon-germanium alloy nanowires, a portion of each second silicon-germanium alloy nanowire 30 underlying the disposable gate structure (50, 51) is not removed. Each remaining portion of the second silicon-germanium alloy nanowire 30 is herein referred to as a silicon-germanium alloy region 30'. The topmost surface of the first dielectric isolation layer 12 is between the first horizontal plane including the top surfaces of the second silicon-germanium alloy nanowires 30 (or remaining portions thereof) and the second horizontal plane including the bottom surface of the second silicon-germanium alloy nanowire 30 (or remaining portions thereof) while the first cavities 29 are formed.

Referring to FIGS. 5A-5D, a dielectric material is conformally deposited and anisotropically etched to form an outer gate spacer 54 and dielectric nanowires 55. The outer gate spacer 54 can be formed around the disposable gate structure (50, 51) simultaneously with formation of the dielectric nanowires 55 by deposition of a dielectric material layer and a subsequent anisotropic etch. The dielectric material can be silicon oxide, silicon nitride, silicon oxynitride, a dielectric metal oxide, or a combination thereof. The dielectric material can be deposited, for example, by chemical vapor deposition. The thickness of the deposited dielectric material is selected such that the entire volume of each first cavity 29 is filled with the dielectric material. The anisotropic etch can be, for example, a reactive ion etch.

The remaining portions of the deposited dielectric material constitute the outer gate spacer 54 and the dielectric nanowires 55. Underneath each silicon-containing nanowire 40, a pair of dielectric nanowires 55 is formed in the first cavities 29. The physically exposed sidewalls of the dielectric nanowires 55 can be vertically coincident with the sidewalls of the silicon-containing nanowires 40. The thickness of the outer gate spacer 54 can be in a range from 5 nm to 50 nm, although lesser and greater thicknesses can also be employed. It is understood that formation of the inner gate spacer 52 is optional, and therefore, the outer gate spacer 54 may be the only gate spacer in some embodiments. In such cases, inner sidewalls of the outer gate spacer 54 can contact sidewalls of the disposable gate structure (50, 51).

Figure 6A:
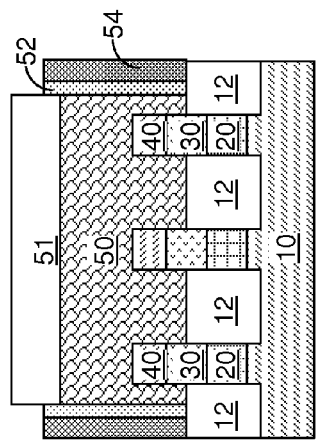
FIG. 6A is a top-down view of an exemplary structure after recessing the first dielectric isolation layer according to an embodiment of the present disclosure.
Figure 6B:
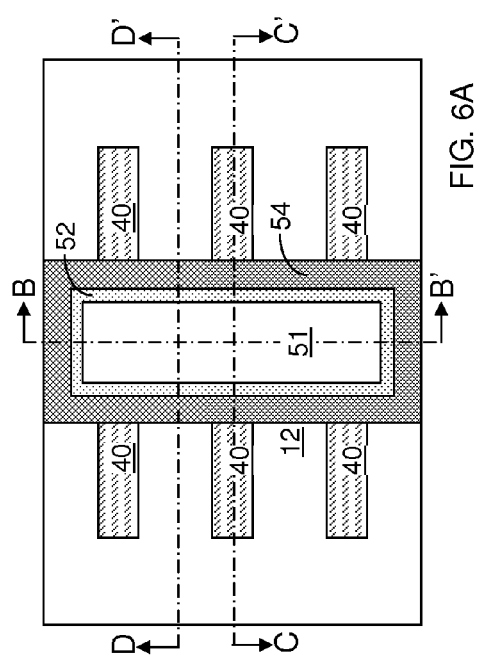
FIG. 6B is a vertical cross-sectional view of the exemplary structure along the vertical plane B-B' of FIG. 6A.
Figure 6D:
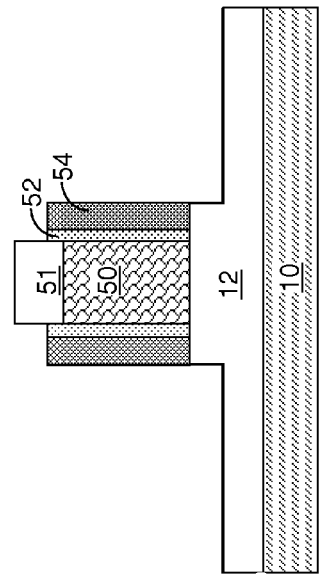
FIG. 6D is a vertical cross-sectional view of the exemplary structure along the vertical plane D-D' of FIG. 6A.
Figure 6C:
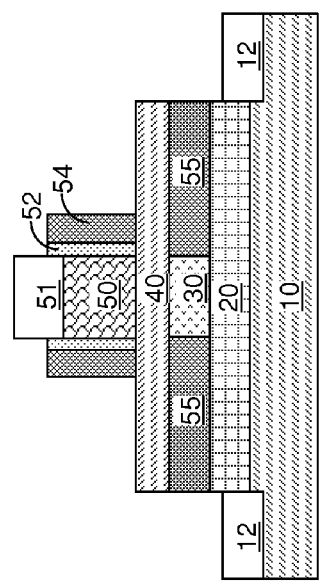
FIG. 6C is a vertical cross-sectional view of the exemplary structure along the vertical plane C-C' of FIG. 6A.
Figure 7A:
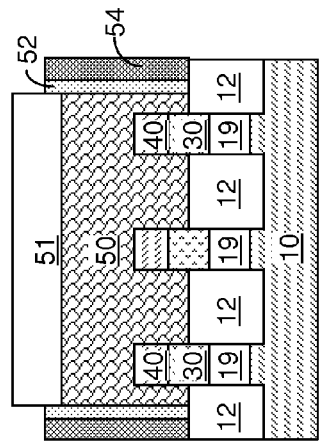
FIG. 7A is a top-down view of an exemplary structure after removal of the first silicon-germanium alloy nanowire by an isotropic etch according to an embodiment of the present disclosure.
Figure 7B:
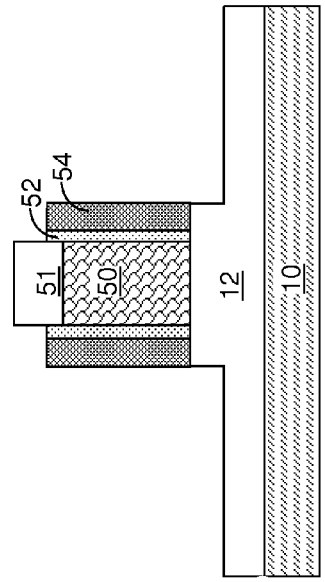
FIG. 7B is a vertical cross-sectional view of the exemplary structure along the vertical plane B-B' of FIG. 7A.
Figure 7C:
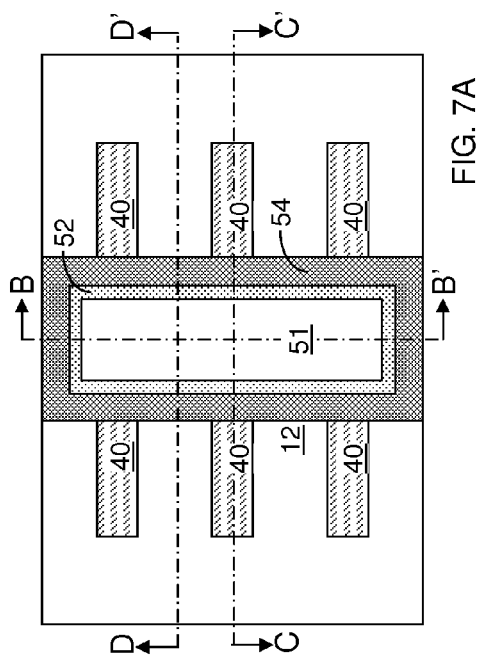
FIG. 7C is a vertical cross-sectional view of the exemplary structure along the vertical plane C-C' of FIG. 7A.
Figure 7D:
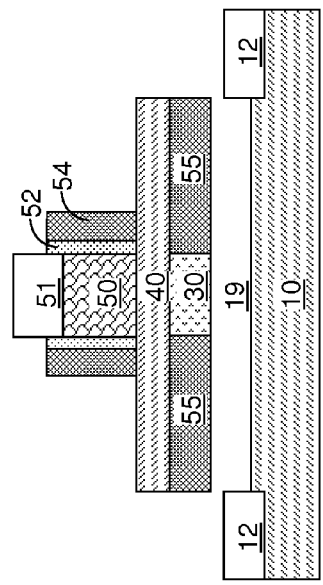
FIG. 7D is a vertical cross-sectional view of the exemplary structure along the vertical plane D-D' of FIG. 7A.
Figure 9A:
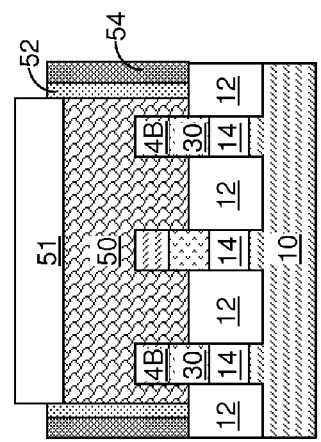
FIG. 9A is a top-down view of an exemplary structure after formation of raised active regions according to an embodiment of the present disclosure.
Figure 9B:
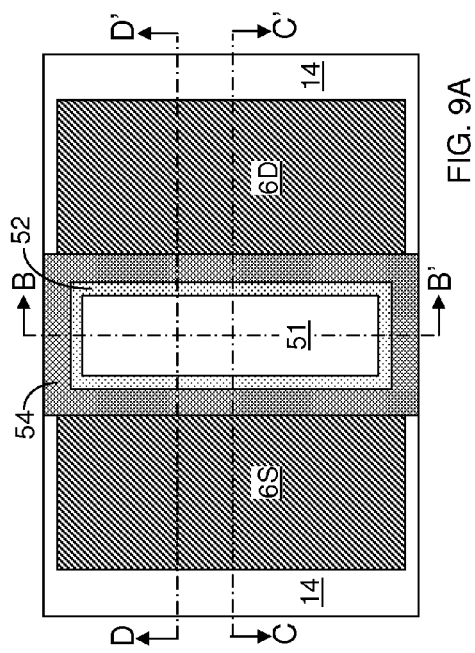
FIG. 9B is a vertical cross-sectional view of the exemplary structure along the vertical plane B-B' of FIG. 9A.
Figure 9C:
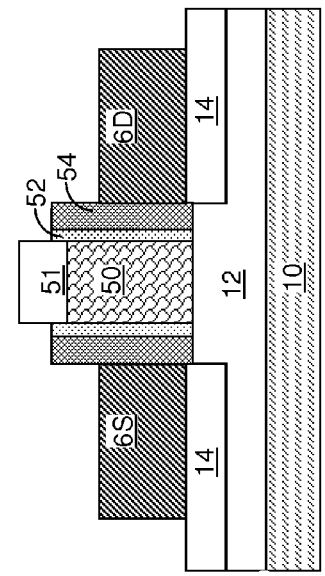
FIG. 9C is a vertical cross-sectional view of the exemplary structure along the vertical plane C-C' of FIG. 9A.
Figure 9D:
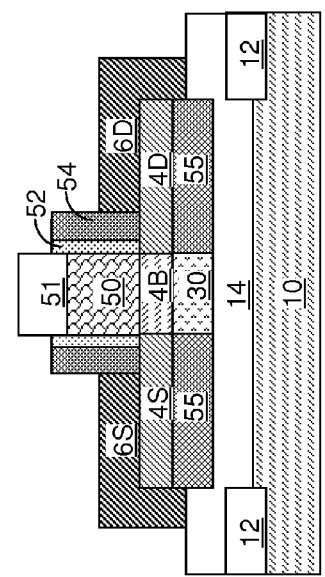
FIG. 9D is a vertical cross-sectional view of the exemplary structure along the vertical plane D-D' of FIG. 9A.
Figure 11A:
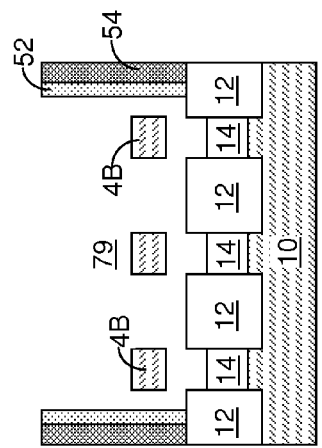
FIG. 11A is a top-down view of an exemplary structure after removal of a remaining portion of the second silicon-germanium nanowire according to an embodiment of the present disclosure.
Figure 11B:
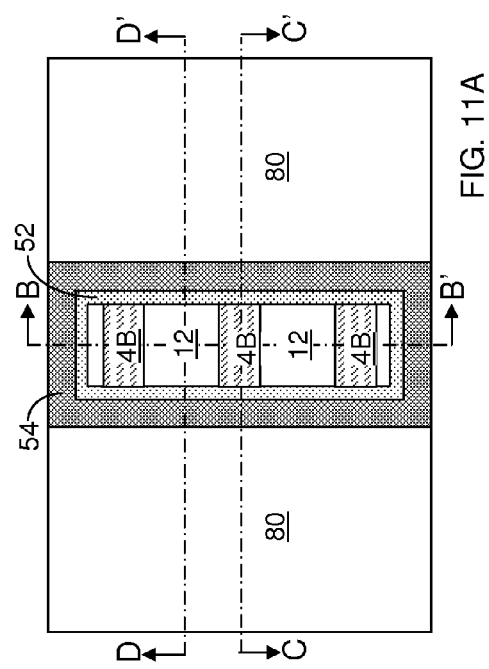
FIG. 11B is a vertical cross-sectional view of the exemplary structure along the vertical plane B-B' of FIG. 11A.
Figure 11C:
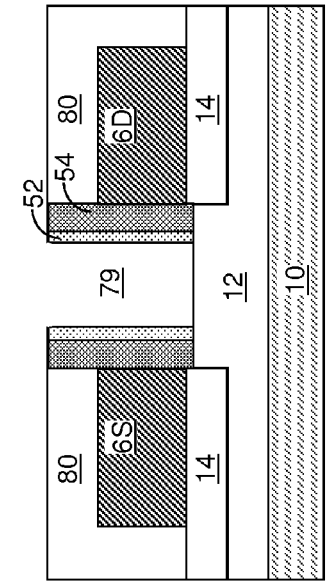
FIG. 11C is a vertical cross-sectional view of the exemplary structure along the vertical plane C-C' of FIG. 11A.
Figure 11D:
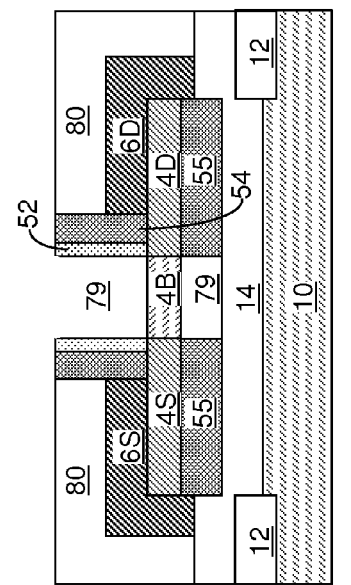
FIG. 11D is a vertical cross-sectional view of the exemplary structure along the vertical plane D-D' of FIG. 11A.

Referring to FIGS. 6A and 6B, the first dielectric isolation layer 12 is recessed employing the combination of the disposable gate structure (50, 51), the inner spacer 52, the outer spacer 54, and the silicon-containing nanowires 40 as an etch mask. The topmost surface of the first dielectric isolation layer 12 is recessed to a height between the second horizontal plane, i.e., the horizontal plane including the interface between the first silicon-germanium alloy nanowires 20 and the silicon-germanium alloy regions 30', and a third horizontal plane including the bottom surfaces of the first silicon-germanium alloy nanowires 20. In one embodiment, the recessing of the first dielectric isolation layer 12 can be performed by an anisotropic etch. In this case, recessed portions of the first dielectric isolation layer 12 can include sidewalls that are vertically coincident with the outer sidewalls of the outer gate spacer 54. In another embodiment, the recessing of the first dielectric isolation layer 12 can be performed by an isotropic etch.

Referring to FIGS. 7A-7D, the first silicon-germanium alloy nanowires 20 are removed by an isotropic etch that removes the first silicon-germanium alloy material at a faster rate than the second silicon-germanium alloy material. The isotropic etch can be a wet etch or an isotropic dry etch. The first silicon-germanium alloy material can have an atomic concentration of germanium that is greater than the atomic concentration of germanium in the second silicon-germanium alloy material by a factor of at least two. In one embodiment, a wet etch chemistry employing hydrogen peroxide can be employed to remove the first silicon-germanium alloy material of the first silicon-germanium alloy nanowires 20 with high selectivity to the second silicon-germanium alloy material of the silicon-germanium alloy regions 30'. In one embodiment, the selectivity of the etch process, i.e., the ratio of the etch rate for the first silicon-germanium alloy material to the etch rate for the second silicon-germanium alloy material, can be in a range from 10 to 1,000, although lesser and greater values for the selectivity of the etch process can also be employed. In one embodiment, the wet etch chemical can consist essentially of water and hydrogen peroxide.

Each first silicon-germanium alloy nanowire 20 is removed from underneath a pair of dielectric nanowires 55 and a silicon-germanium alloy region 30'. The entirety of each first silicon-germanium alloy nanowire 20 is removed by the isotropic etch. The duration of the isotropic etch is selected such that etching of the silicon-germanium alloy regions 30' is minimized. A second cavity 19 is formed in each volume from which a first silicon-germanium alloy nanowire 20 is removed. Each adjoined combination of a silicon-containing nanowire 30, a silicon-germanium alloy region 30', and a pair of dielectric nanowires 55 is suspended above the top surface of the substrate 10 by the disposable gate structure (50, 51), and is separated from the substrate 10 by a second cavity 19.

Referring to FIGS. 8A-8D, the second cavities 19 are filled with a dielectric material by depositing a second dielectric isolation layer 14. The second dielectric isolation layer 14 can be deposited employing a self-planarizing deposition method such as spin-on coating. Alternately, the second dielectric isolation layer 14 can be deposited employing a conformal deposition method such as chemical vapor deposition method, and can be subsequently planarized and/or recessed to provide a planar top surface. In case a conformally deposited dielectric material is planarized, the top surface of the disposable gate structure (50, 51) can be employed as a stopping layer during a planarization process. The amount of the deposited material during a spin-on coating, or the depth of recess during the recessing of a conformally deposited dielectric material, can be selected such that a planar top surface of the second dielectric isolation 14 is formed between the first horizontal plane, i.e., the horizontal plane including the bottom surfaces of the silicon nanaowires 40, and the second horizontal plane, i.e., the horizontal plane including the bottom surfaces of the silicon-germanium alloy regions 30' and the dielectric nanowires 55.

The second dielectric isolation layer 14 includes a dielectric material such as undoped silicate glass, doped silicate glass, silicon oxynitride, organosilicate glass (OSG), a dielectric metal oxide, a dielectric metal oxynitride, or a combination thereof. The materials of the first dielectric isolation layer 12 and the second dielectric isolation layer 14 may be the same, or may be different.

Referring to FIGS. 9A-9D, active regions (4S, 4D) can be formed at this step by implantation of electrical dopants, which can be p-type dopants and/or n-type dopants, into physically exposed portions of the silicon-containing nanowires 40. As used herein, an "active region" can be a source region or a drain region of a field effect transistor. The active regions (4S, 4D) include source regions 4S and drain regions 4D. Each unimplanted portion of a silicon-containing nanowire 40 constitutes a body region 4B.

Raised active regions (6S, 6D) can be formed on physically exposed semiconductor surfaces of the silicon-containing nanowires 40 by selective deposition of a semiconductor material. As used herein, a "raised active region" can be a raised source region or a raised drain region. The raised active regions (6S, 6D) include a raised source region 6S that is formed on the source regions 4S, and a raised drain region 6D that is formed on the drain regions 4D.

In one embodiment, the selective deposition of the semiconductor material can be performed by a selective epitaxy process. During the selective epitaxy process, the deposited semiconductor material grows from physically exposed semiconductor surfaces, i.e., the physically exposed surfaces of the source regions 4S and the drain regions 4D. The semiconductor material does not grow from dielectric surfaces such as the surfaces of the gate cap dielectric portion 51, the inner gate spacer 52, the outer gate spacer 54, and the second dielectric isolation layer 14.

The raised active regions (6S, 6D) can be epitaxially aligned to the silicon-containing nanowires (4S, 4D, 4B). The raised active regions (6S, 6D) can include the same semiconductor material as, or a semiconductor material different from, the semiconductor material of the silicon-containing nanowires (4S, 4D, 4B). The growth of the raised active regions (6S, 6D) can proceed with, or without, crystallographically faceted surfaces depending on the deposited semiconductor material and the deposition conditions.

In one embodiment, the selective epitaxy process can proceed until multiple semiconductor material portions grown from neighboring portions of silicon-containing nanowires (4S, 4D, 4B) merge to form raised active regions (6S, 6D) such that the raised source region 6S contacts all source regions 4S and the raised drain region 6D contacts all drain regions 4D.

In one embodiment, the raised active regions (6S, 6D) can be formed with in-situ doping during the selective epitaxy process. Thus, each portion of the raised active regions (6S, 6D) can be formed as doped semiconductor material portions. Alternatively, the raised active regions (6S, 6D) can be formed by ex-situ doping. In this case, the raised active regions (6S, 6D) can be formed as intrinsic semiconductor material portions and electrical dopants can be subsequently introduced into the raised active regions (6S, 6D) to convert the raised active regions (6S, 6D) into doped semiconductor material portions.

Formation of raised active regions (6S, 6D) is optional. Embodiments in which raised active regions are not formed are also contemplated herein.

Referring to FIGS. 10A-10D, a planarization dielectric layer 80 can be formed over the raised active regions (6S, 6D) and directly on surfaces of the second dielectric isolation layer 14, and is planarized to provide a planar top surface. The dielectric material of the planarization dielectric layer 80 can be deposited, for example, by chemical vapor deposition (CVD) or spin coating. The planarization dielectric layer 80 includes a dielectric material such as silicon oxide, silicon nitride, silicon oxynitride, organosilicate glass (OSG), or a combination thereof. Chemical mechanical planarization (CMP) can be employed to planarized the top surface of the planarization dielectric layer 80. In one embodiment, the gate cap dielectric portion 51 can be employed as a stopping structure during the planarization process.

The disposable gate structure (50, 51) is subsequently removed selective to the planarization dielectric layer 80, the inner and outer gate spacers (52, 54), the silicon-containing nanowires (4S, 4D, 4B), and the first dielectric isolation layer 12. At least one isotropic etch and/or at least one anisotropic etch may be employed to removed the disposable gate structure (50, 51). The gate cap dielectric portion 51 can be removed by a wet etch or a dry etch. Alternately, the gate cap dielectric portion 51 can be removed during the planarization of the top surface of the planarization dielectric layer 80. If the disposable material portion 50 includes amorphous carbon or diamond-like carbon (DLC), the disposable material portion 50 can be removed by ashing. Depending on the composition of the disposable material portion 50, a suitable etch chemistry can be selected in order to remove the disposable material portion 50 while minimizing collateral etching of the planarization dielectric layer 80, the inner and outer gate spacers (52, 54), the silicon-containing nanowires (4S, 4D, 4B), and the first dielectric isolation layer 12. A gate cavity 79 is formed in the volume from which the disposable gate structure (50, 51) is removed. The etch processes that remove the disposable gate structure (50, 51) may, or may not, be selective to the silicon-germanium alloy regions 30'.

Referring to FIGS. 11A-11D, the silicon-germanium alloy regions 30', i.e., the remaining portions of the second silicon-germanium nanowires 30, are removed selective to the silicon-containing nanowires (4S, 4D, 4B) the dielectric nanowires 55. Thus, the gate cavity 79 is extended laterally and vertically by removing the silicon-germanium alloy regions 30' and the dielectric nanowires 55.

Referring to FIGS. 12A-12D, a replacement gate structure (90, 92) can be formed in the gate cavity 79 by deposition of a gate dielectric layer and at least one conductive material layer. The gate dielectric layer can include any gate dielectric material known in the art. The at least one conductive material layer can include any conductive material that is known to be suitable for a gate electrode of a field effect transistor. Excess portion of the at least one conductive material layer and the gate dielectric layer can be removed from above the top surface of the planarization dielectric layer 80, for example, by chemical mechanical planarization (CMP). The remaining portion of the gate dielectric layer constitutes a gate dielectric 90 of the replacement gate structure (90, 92), and the remaining portion of the at least one conductive material layer constitutes a gate electrode 92 of the replacement gate structure (90, 92).

The gate dielectric 90 laterally surrounds each body region 4B of the silicon-containing nanowires (4S, 4D, 4B).

In one embodiment, the gate dielectric 90 can be a single contiguous structure that contacts all surfaces of the body regions 4B and the inner sidewalls of the inner gate spacer 52 and the top surfaces of the first and second dielectric isolation layers (12, 14).

A contact level dielectric layer 95 can be formed over the planarization dielectric layer 80. The contact level dielectric layer 95 includes a dielectric material such as organosilicate glass (OSG), silicon oxide, silicon nitride, or a combination thereof. The contact level dielectric layer 95 can be formed, for example, by chemical vapor deposition (CVD) or spin coating. Various contact via structures (9S, 9D, 9G) can be formed through the contact level dielectric layer 95 and the planarization dielectric layer 80. The contact via structures (9S, 9D, 9B) can include a source contact via structure 9S that contacts the raised source region 6S, a drain contact via structure 9D that contacts the raised drain region 6D, and a gate contact via structure 9G that contacts the gate electrode 92.

The exemplary semiconductor structure includes, among others, at least one dielectric isolation layer (12, 14), at least a silicon-containing nanowire (4S, 4D, 4B) overlying the at least one dielectric isolation layer (12, 14), a pair of dielectric nanowires 55 laterally spaced from each other and contacting a bottom surface of the silicon-containing nanowire (4S, 4D, 4B) and a top surface of the at least one dielectric isolation layer (12, 14), and a gate structure (90, 92) including a gate dielectric 90 and a gate electrode 92. The gate structure (90, 92) encircles, i.e., laterally surrounds, a portion of the silicon-containing nanowire (4S, 4D, 4B), and specifically, a body region 4B within the silicon-containing nanowire (4S, 4D, 4B).

The pair of dielectric nanowires 55 is laterally spaced from each other by a portion of the gate structure (50, 52) that underlies the silicon-containing nanowire (4S, 4D, 4B). The combination of the pair of dielectric nanowires 55 and the portion of the gate structure (90, 92) that underlies the silicon-containing nanowire (4S, 4D, 4B) can have the same horizontal cross-sectional area as the silicon-containing nanowire (4S, 4D, 4B).

In one embodiment, the at least one dielectric isolation layer can include a first dielectric isolation layer 12 located on a substrate 10 and including at least one rectangular opening (corresponding to the regions underlying the silicon-containing nanowires (4S, 4D, 4B) and filled with portions of a second dielectric isolation layer 14) therethrough, and the second dielectric isolation layer 14 contacting a top surface of the first dielectric isolation layer 12 and including a recessed portion that fills the at least one opening. In one embodiment, the silicon-containing nanowire (4S, 4D, 4B) overlies, and has a same horizontal cross-sectional area as, the recessed portion of the second dielectric isolation layer 14.

In one embodiment, the pair of dielectric nanowires 55 contacts a top surface of the recessed portion of the second dielectric isolation layer 14. In one embodiment, the combination of the pair of dielectric nanowires 55 and the portion of the gate structure (90, 92) that underlies the silicon-containing nanowire (4S, 4D, 4b) can have the same horizontal cross-sectional area as the recessed portion of the second dielectric isolation layer 14.

In one embodiment, a topmost surface of the first dielectric isolation layer 12 can be located between a horizontal plane including a bottommost surface of the second dielectric isolation layer 14 and another horizontal plane including a topmost surface of the second dielectric isolation layer 14. A bottommost surface of the first dielectric isolation layer 12 can be located below the horizontal plane including the bottommost surface of the second dielectric isolation layer 14.

In one embodiment, each of the pair of dielectric nanowires 55 can have an end wall that is vertically coincident with an end wall of the silicon-containing nanowire (4S, 4D, 4B). The end walls are perpendicular to the lengthwise direction of the silicon-containing nanowire (4S, 4D, 4B). An outer gate spacer 54 can laterally surround an upper portion of the gate structure (90, 92) and include the same dielectric material as the pair of dielectric nanowires 55.

The exemplary semiconductor structure of the present disclosure includes a field effect transistor in which the gate electrode 92 encircles each body region 4B of the silicon-containing nanowires (4S, 4D, 4B). Thus, effective control of the plurality of channels in the body regions 4B of the silicon-containing nanowires (4S, 4D, 4B) can be provided by the wrap-around structure of the gate electrode 92, thereby reducing the off-state leakage current and well-defined threshold voltage for the field effect transistor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   at least one dielectric isolation layer located on a substrate;
   a silicon-containing nanowire containing a source region located at one end of a body region and a drain region located at another end of said body region, said silicon-containing nanowire is located above and spaced apart from said at least one dielectric isolation layer;
   a pair of dielectric nanowires laterally spaced from each other, and contacting a bottom surface of said source region and said drain region of said silicon-containing nanowire and a top surface of said at least one dielectric isolation layer; and
   a gate structure including a gate dielectric and a gate electrode, said gate structure encircling said body region of said silicon-containing nanowire.

2. The semiconductor structure of claim 1, wherein said pair of dielectric nanowire is laterally spaced from each other by a portion of said gate structure that is located beneath, and directly contacting, a bottom surface of said body region of said silicon-containing nanowire.

3. The semiconductor structure of claim 2, wherein a combination of said pair of dielectric nanowires and said portion of said gate structure that is located beneath said body region of said silicon-containing nanowire has a same horizontal cross-sectional area as said silicon-containing nanowire.

4. The semiconductor structure of claim 1, wherein said at least one dielectric isolation layer comprises:
   a first dielectric isolation layer located on a substrate and including at least one rectangular opening therethrough; and a second dielectric isolation layer contacting a top surface of said first dielectric isolation layer and including a recessed portion that fills said at least one opening.

5. The semiconductor structure of claim 4, wherein said silicon-containing nanowire is present above, and has a same horizontal cross-sectional area as, said recessed portion of said second dielectric isolation layer.

6. The semiconductor structure of claim 4, wherein said pair of dielectric nanowires contacts a top surface of said recessed portion.

7. The semiconductor structure of claim 6, wherein a combination of said pair of dielectric nanowires and said portion of said gate structure that is located beneath said body region of said silicon-containing nanowire has a same horizontal cross-sectional area as said recessed portion.

8. The semiconductor structure of claim 4, wherein a topmost surface of said first dielectric isolation layer is located between a horizontal plane including a bottommost surface of said second dielectric isolation layer and another horizontal plane including a topmost surface of said second dielectric isolation layer, and a bottommost surface of said first dielectric isolation layer is located below said horizontal plane including said bottommost surface of said second dielectric isolation layer.

9. The semiconductor structure of claim 1, wherein each of said pair of dielectric nanowires has an end wall that is vertically coincident with an end wall of said silicon-containing nanowire.

10. The semiconductor structure of claim 1, further comprising a gate spacer laterally surrounding an upper portion of said gate structure and comprising a same dielectric material as said pair of dielectric nanowires.

* * * * *